INSULATED GATE FIELD EFFECT TRANSISTOR USING LEAD SALT

Filed June 29, 1966

INVENTORS
James F. Skalski
Marcella C. Petree
BY J. O. Tresansky
ATTORNEY
H R Booker
AGENT 3,405,331

INSULATED GATE FIELD EFFECT TRANSISTOR USING LEAD SALT

James F. Skalski, West Hyattsville, and Marcella C. Petree, Silver Spring, Md., assignors to the United States of America as represented by the Secretary of the Navy Filed June 29, 1966, Ser. No. 562,446
12 Claims. (Cl. 317—235)

The invention described herein may be manufactured and used by or for the Government of the United States of America for governmental purposes without the payment of any royalties thereon or therefor.

This invention relates to thin film semiconductors and more particularly to active thin film field effect semiconductor devices.

With the development of thin film passive components and work in the solid state field toward further miniaturization and reduction of components, a great need has arisen for active thin film semiconductors which are compatible with passive thin film components. As well as compatibility, other characteristics of thin film components like reproducibility, high mobility, high temperature stability, and resistance to radiation are also very desirable, especially when operating in extreme environments such as those of missile, torpedo, and satellite applications.

In the past several methods of fabricating active thin film semiconductors have been employed. Among these, the most common have been vapor depositing polycrystalline films on a substrate, pyrolytic decomposition of a monocrystalline film on an insulating substrate, or growing a vapor-deposited monocrystalline film upon a glazed substrate. All of these techniques have produced active thin film semiconductors which have been satisfactory to some degree. However, the polycrystalline devices have met problems in reproduction and in maintaining high reliability in some applications and the monocrystalline active thin film fabrication techniques have not been very compatible with known passive thin film fabrication.

Accordingly, therefore, it is an object of this invention to provide a new and improved active thin film semiconductor device.

Another object is to provide a method of fabricating active thin film semiconductor device which is compatible with passive thin film fabrication procedures.

Still another object is the provision of a new and improved monocrystalline thin film field effect transistor.

Yet another object is the provision of a method of fabricating an active thin film field effect semiconductor device comprising an epitaxial film of a lead salt.

Still yet another object is to provide a new and improved monocrystalline field effect transistor using a semiconductor material having high mobility and a high dielectric constant.

These and other objects are attained in accordance with the invention by fabricating an active thin film field effect semiconductor having a single crystalline film of a lead salt which is made in a manner compatible with passive thin film fabrication methods.

Other objects, features, and attendant advantages of this invention will be readily appreciated as the same becomes better understood by reference to the accompanying drawing wherein.

Figure 1:
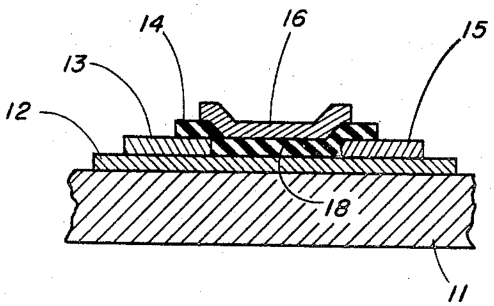
FIG. 1 illustrates a cross-sectional view of one embodiment of the invention.

Referring now to the drawing, FIG. 1 shows a coplanar structure which forms a thin film field effect transistor which is operable in either enhancement or depletion modes as described below. In this embodiment of the invention, insulating substrate 11 has a thin epitaxial semiconductor film 12 deposited thereon. A source electrode 13 and a drain electrode 15 are deposited on the semiconductor 12 with a narrow gap 18 existing between the source and drain electrodes. An insulator 14 separates a gate electrode 16 from the semiconductor film and the source and drain electrodes.

In preparation of the thin film active semiconductor in accordance wtih the invention, a method compatible with the formation of passive thin film devices is utilized. In FIG. 1, a flat insulating substrate which may be NaCl or any other appropriate substrate material is prepared and a thin film of semiconductor material 12, selected from the group of lead salts e.g. the sulfides, selenides and tellurides of lead, are epitaxially deposited on the substrate. When evaporating and depositing a semiconductor film such as lead telluride, the temperature is elevated to a range of 200° C. to 350° C. After the semiconductor material is deposited on the substrate a precision evaporation mask is then used to precisely evaporate the metallic source and drain electrodes directly onto the semiconductor film in a manner forming a narrow gap region 18 between electrodes. The metal electrodes, which may be gold for example, are evaporated in a vacuum at room temperature or approximately 200° C. to 300° C. Next, an insulator film 14 is vapor deposited at a temperature of 150° C. to 300° C. directly over the electrodes and the semiconductor gap 18. Several insulator materials are satisfactory but especially good results are achieved with NaCl or $CaF_2$. A final mask is placed over the transistor structure and a third metal film is evaporated over the narrow gap region at 200° C. to 300° C. to form the gate electrode 16 of the field effect transistor. After cooling the substrate is removed from the vacuum environment and various electrical connections are then made to the electrode contacts.

Figure 2:
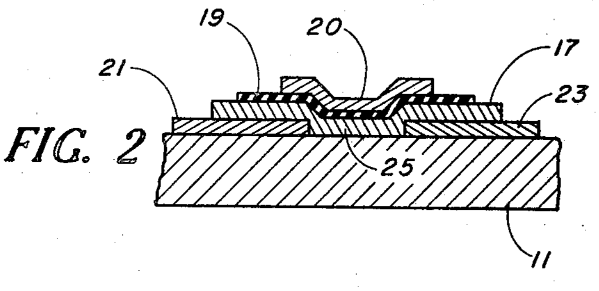
FIG. 2 illustrates a cross-sectional view of another embodiment of the invention.

In FIG. 2 an alternative structure single crystal field effect transistor is illustrated. Metal electrodes 21 and 23 are deposited epitaxially upon the insulated substrate 11 leaving a narrow gap region 25. A semiconductor film 17 is deposited epitaxially first as a single crystal upon the insulating substrate 11 and then the insulator film 19 is deposited epitaxially on the semiconductor film. A single crystal metal gate film 20 is then deposited upon the insulator gate film also epitaxially forming a single crystal with the insulator film 19. In this manner an entire single crystal transistor may be manufactured.

Figure 3:
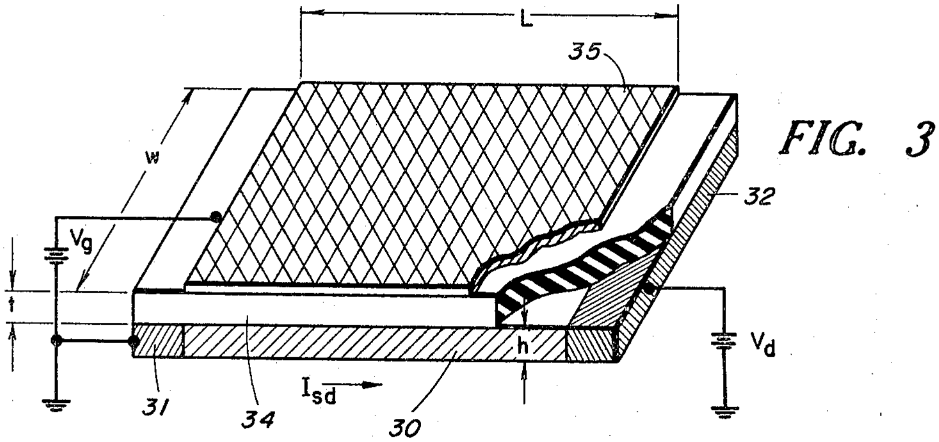
FIG. 3 illustrates an isometric view of a thin film field effect transistor.

In FIG. 3 the thin film transistor is shown in an operative condition with a voltage supply $V_g$ connected between the source electrode 31 and gate electrode 35 and a connection to ground through battery $V_d$ from drain electrode 32. Insulator 34 is deposited between the electrode 35 and semiconductor 30 in the manner described in the FIGS. 1 and 2. Semiconductor 30 forms a gap of length L between source electrode 31 and drain electrode 32 which is large compared to the thickness $h$. The insulated gate thin film transistor shown in FIG. 3 is a majority carrier, unipolar, amplifying device whose basic operation depends upon the modulation of the conductivity of the semiconductor by induction of charge with an electric field. Current flows between source electrode 31 and drain electrode 32 when voltage $V_d$ is connected to ground. A voltage $V_g$ between gate electrode 35 and source electrode 31 modulates the current $I_{sd}$ between the source and drain by inducing a greater or lesser number of charges in the semiconductor film 30 thereby varying the resistance of the film.

In the depletion mode of operation the thin film transistor has a large current normaly flowing between the source and drain electrodes when the gate 35 is at the same potential as the source. The drain current is depleted by applying a voltage of the proper polarity $V_g$ to the gate. The enhancement mode of operation, however, is normally off with no voltage on gate 35 but it may be turned on by applying a voltage $V_g$ to the gate. The feasibility of both modes of operation allows greater flexibility in circuit design. Layer 34 permits the gate 35 to be biased either positively or negatively with respect to the source $V_g$ without drawing appreciable gate current. In the enhancement mode the saturation phenomenon in the film effect transistor results from the pinch off of the induced conduction channel in the region of the drain electrode 32. The rising potential along the channel from source to drain relative to the gate potential causes a gradation from an accumulation layer near the source electrode 31 to a depletion layer near the drain electrode 32.

The semiconductor materials found most satisfactory for this invention have been lead telluride or other similar lead salts. Lead salts are desirable because they have a single crystal structure and a high carrier mobility. Because of the single crystal structure and high mobility of lead telluride, the semiconductor film has a large transconductance and gain bandwidth product for the field effect transistor. The lead salts also have large dielectric constants permitting great field penetration depth for modulation purposes. With the use of lead salts the thin film transistor has reproducible and predictable characteristics, high stability, and is radiation resistant.

From an operational point of view the thin film insulated gate, field effect transistor shown in FIG. 3 operates similarly to a vacuum triode that has characteristics more nearly corresponding to those of the pentode, wherein the gate 35 corresponds to the grid, the source electrode 31 corresponds to the cathode, and the drain electrode 32 to the plate of a triode. The voltage $V_g$ between the gate and source electrodes modulates the current $I_{sd}$, as mentioned before, by inducing a certain number of charge carriers. Therefore, in essence, the active semiconductor layer 30 together with the gate electrode 35 forms a capacitor. When a gate voltage $V_g$ is applied this capacitor becomes charged, thereby modulating the drain current which gives rise to transconductance and gain bandwidth.

Insulator films used in the operation of the thin film field device of the invention which have been found to operate satisfactorily are NaCl, MgO, and $CaF_2$. The insulator film thickness is small relative to the thickness of the semiconductor film and may form a single crystalline structure with the semiconductor and/or with certain metals such as lead or gold. An active thin film field effect transistor therefore is produced which comprises a single crystalline structure consisting of the gate electrode, source and drain electrodes, an insulator and a semi-conductor. The single crystal structure of the transistor insures reproducibility and predictability of the transistor and minimizes surface traps and interface traps to give a completely compatible active thin film semiconductor which may be connected to passive thin film components on insulating substrates.

Obviously many modifications and variations of the present invention are possible in the light of the above teachings. It is therefore to be understood that within the scope of the appended claims the invention may be practiced otherwise than as specifically described.

We claim:

1. A thin film active semiconductor comprising an insulating substrate, an epitaxial semiconductor film of a lead salt deposited thereon, and first and second spaced apart ohmic electrodes forming electrical junctions on said semiconductor film, whereby said semiconductor material provides a low resistance electrical path between said electrodes.

2. The device of claim 1 further comprising biasing means connecting said first and second electrodes establishing an electrical signal path therebetween, a third electrode separated from said first and second electrodes by a thin layer of insulating material, and means connected between said third and first electrodes for modulating said electrical signal.

3. The device of claim 1 wherein said semiconductor is a field effect transistor further comprising, an insulator film deposited on said semiconductor film, and a metallic gate electrode film deposited on said insulator film.

4. The device of claim 3 wherein said trainsistor gate film, insulator film, semiconductor film and insulating substrate form a single crystalline structure.

5. The device of claim 1 wherein said lead salt is lead telluride and said insulating substrate is sodium chloride.

6. The device of claim 5 wherein said electrodes are deposited films on said semiconductor film.

7. The device of claim 5 wherein said electrodes are epitaxially deposited on said inslating substrate and said semiconductor film is deposited upon and between said electrodes, whereby said electrodes and said semiconductor film form a single crystal with said insulating substrate.

8. The transistor of claim 3 wherein said gate electrode material is lead and said insulator film is soduim chloride.

9. The method of manufacturing a thin film monocrystalline active semiconductor on an insulating substrate comprising the steps of vapor desspositing an epitaxial film of lead salt on an insulating substrate, vapor depositing a set of metallic ohmic electrodes on the semiconductor film forming a narrow gap region of film between the electrodes, vapor depositing a thin film of insulator material on the electrodes and semiconductor gap, and vapor depositing a thin metal electrode film on said insulator film, whereby a monocrystalline thin film active semiconductor is formed on said substrate.

10. The method of claim 9 wherein all the steps of vapor depositing are epitaxially depositing steps.

11. The method of compatibly forming a thin film electronic network on an insulating substrate having at least one monocrystalline active semiconductor and a thin film passive device comprising the steps of claim 9 for depositing said semiconductor, further comprising, vapor depositing a thin layer passive device on said substrate, and electrically joining said passive device to at least one of said electrodes of said semiconductor.

12. The transistor of claim 3 wherein said gate electrode material is gold and said insulator film is calcium fluoride.

No references cited.

JOHN W. HUCKERT, *Primary Examiner.*

M. EDLOW, *Assistant Examiner.*